US007959985B2

(12) United States Patent
Ishizaka et al.

(10) Patent No.: US 7,959,985 B2
(45) Date of Patent: *Jun. 14, 2011

(54) METHOD OF INTEGRATING PEALD TA-CONTAINING FILMS INTO CU METALLIZATION

(75) Inventors: Tadahiro Ishizaka, Watervliet, NY (US); Tsukasa Matsuda, Delmar, NY (US); Masamichi Hara, Clifton Park, NY (US); Jacques Faguet, Albany, NY (US); Yasushi Mizusawa, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 749 days.

This patent is subject to a terminal disclaimer.

(21) Appl. No.: 11/378,263

(22) Filed: Mar. 20, 2006

(65) Prior Publication Data
US 2007/0218683 A1 Sep. 20, 2007

(51) Int. Cl.
  C23C 16/00 (2006.01)
  H05H 1/00 (2006.01)
(52) U.S. Cl. .................. 427/569; 438/597; 438/648
(58) Field of Classification Search .................. None
See application file for complete search history.

(56) References Cited

U.S. PATENT DOCUMENTS

| 6,049,174 | A | 4/2000 | Pirrie et al. | |
|---|---|---|---|---|
| 6,107,197 | A * | 8/2000 | Suzuki | 438/677 |
| 2002/0031618 | A1 * | 3/2002 | Sherman | 427/569 |
| 2002/0060363 | A1 * | 5/2002 | Xi et al. | 257/751 |
| 2002/0106846 | A1 * | 8/2002 | Seutter et al. | 438/200 |
| 2002/0192952 | A1 | 12/2002 | Itoh et al. | |
| 2003/0017697 | A1 * | 1/2003 | Choi et al. | 438/679 |
| 2004/0086434 | A1 * | 5/2004 | Gadgil et al. | 422/186.04 |
| 2004/0092132 | A1 * | 5/2004 | Doan et al. | 438/785 |
| 2004/0104439 | A1 * | 6/2004 | Haukka et al. | 257/368 |
| 2004/0121085 | A1 * | 6/2004 | Wang et al. | 427/569 |
| 2004/0142555 | A1 * | 7/2004 | Kamepalli et al. | 438/643 |
| 2004/0175926 | A1 * | 9/2004 | Wang et al. | 438/627 |
| 2006/0223300 | A1 * | 10/2006 | Simka et al. | 438/618 |

OTHER PUBLICATIONS

Prasad, et. al. App. Surf. Sci., 1994, 74, p. 115-120.*
Ju Youn Kim, et al., "Barrier Characteristics of TaN Films Deposited by Using the Remote Plasma Enhanced Atomic Layer Deposition Method", Journal of the Korean Physical Society, vol. 45, No. 4, Oct. 2004, pp. 1069-1073.

(Continued)

Primary Examiner — Timothy H Meeks
Assistant Examiner — Joseph Miller, Jr.
(74) Attorney, Agent, or Firm — Oblon, Spivak, McClelland, Maier & Neustadt, L.L.P.

(57) ABSTRACT

A method for forming a modified TaC or TaCN film that may be utilized as a barrier film for Cu metallization. The method includes disposing a substrate in a process chamber of a plasma enhanced atomic layer deposition (PEALD) system configured to perform a PEALD process, depositing a TaC or TaCN film on the substrate using the PEALD process, and modifying the deposited TaC or TaCN film by exposing the deposited TaC or TaCN film to plasma excited hydrogen or atomic hydrogen or a combination thereof in order to remove carbon from at least the plasma exposed portion of the deposited TaCN film. The method further includes forming a metal film on the modified TaCN film, where the modified TaCN film provides stronger adhesion to the metal film than the deposited TaCN film. According to one embodiment, a TaCN film is deposited from alternating exposures of TAIMATA and plasma excited hydrogen.

34 Claims, 8 Drawing Sheets

OTHER PUBLICATIONS

Y. Yasaka, et al., "Production of large-diameter plasma using multi-slotted planar antenna", Plasma Source Science Technology, vol. 8, No. 4, Nov. 1999, pp. 530-533.

Jin-Seong Park, et al., "Plasma-Enhanced Atomic Layer Deposition of Tantalum Nitrides Using Hydrogen Radicals as a Reducing Agent", Electrochemical and Solid-State Letters, vol. 4, No. 4, 2001, pp. C17-C19.

* cited by examiner

METHOD OF INTEGRATING PEALD TA-CONTAINING FILMS INTO CU METALLIZATION

FIELD OF INVENTION

The present invention relates to a method of plasma enhanced atomic layer deposition for semiconductor manufacturing, and more particularly to a method of forming Ta-containing films that may be utilized as a barrier layer in Cu metallization.

BACKGROUND OF THE INVENTION

Typically, during materials processing, plasma is employed to facilitate the addition and removal of material films when fabricating composite material structures. For example, in semiconductor processing, a (dry) plasma etch process is utilized to remove or etch material along fine trenches or within vias or contacts patterned on a silicon substrate. Alternatively, for example, a vapor deposition process is utilized to deposit material along fine lines or within vias or contacts on a silicon substrate. In the latter, vapor deposition processes include chemical vapor deposition (CVD), and plasma enhanced chemical vapor deposition (PECVD).

In PECVD, plasma is utilized to alter or enhance the film deposition mechanism. For instance, plasma excitation generally allows film-forming reactions to proceed at temperatures that are significantly lower than those typically required to produce a similar film by thermally excited CVD. In addition, plasma excitation may activate film-forming chemical reactions that are not energetically or kinetically favored in thermal CVD. The chemical and physical properties of PECVD films may thus be varied over a relatively wide range by adjusting process parameters.

More recently, atomic layer deposition (ALD), a form of CVD or more generally film deposition, has emerged as a candidate for ultra-thin gate film formation in front end-of-line (FEOL) operations, as well as ultra-thin barrier layer and seed layer formation for metallization in back end-of-line (BEOL) operations. In ALD, two or more process gases are introduced alternately and sequentially in order to form a material film about one monolayer (or less) at a time. Such an ALD process has proven to provide improved uniformity and control in layer thickness, as well as conformality to features on which the layer is deposited. However, current ALD processes often suffer from contamination problems that affect the quality of the deposited ALD films, and the interfaces between the ALD films and other films in a manufactured device.

The introduction of copper (Cu) metal into multilayer metallization schemes for manufacturing integrated circuits can necessitate the use of diffusion barriers/liners to promote adhesion and growth of the Cu layers and to prevent diffusion of Cu into the dielectric materials. Barriers/liners that are deposited onto dielectric materials can include refractive materials, such as tungsten (W), molybdenum (Mo), and tantalum (Ta), that are non-reactive and immiscible in Cu, and can offer low electrical resistivity. For example, Cu integration schemes for technology nodes less than or equal to 130 nm can utilize a low dielectric constant (low-k) inter-level dielectric, followed by a physical vapor deposition (PVD) of a Ta film or a TaN/Ta film, followed by a PVD Cu seed layer, and an electrochemical deposition (ECD) Cu fill. Generally, Ta films are chosen for their adhesion properties, and TaN/Ta films are generally chosen for their barrier properties (i.e., their ability to prevent Cu diffusion into the low-k film).

The presence of impurities in Ta-containing films can result in weak adhesion between a bulk Cu layer and the Ta-containing films, which in turn can result in electro-migration (EM) and stress migration (SM) problems, as well as reduced device production yields. Thus, new processing methods are needed for improving the properties and integration of Ta-containing films into Cu metallization schemes.

SUMMARY OF THE INVENTION

Accordingly, one object of the present invention is directed to improving the properties and integration of Ta-containing films in Cu metallization.

Another object of the present invention is directed to depositing a TaC or a TaCN film by plasma enhanced atomic layer deposition (PEALD), and plasma treating the deposited TaC or TaCN film to form a modified TaC or TaCN film with reduced carbon content and has good adhesion to metal films such as Ru or Cu.

According to one embodiment of the invention, a method is provided for processing a substrate, where the method includes disposing a substrate in a process chamber of a plasma enhanced atomic layer deposition (PEALD) system configured to perform a PEALD process, depositing a TaC or TaCN film on the substrate using the PEALD process, modifying the deposited TaC or TaCN film by exposing the deposited TaC or TaCN film to plasma excited hydrogen or atomic hydrogen or a combination thereof in order to remove carbon from at least the plasma exposed portion of the deposited TaC or TaCN film, and forming a metal film on the modified TaC or TaCN film, where the modified TaC or TaCN film provides stronger adhesion to the metal film than the deposited TaC or TaCN film.

According to another embodiment of the invention, a method is provided for processing a substrate, where the method includes disposing a substrate in a process chamber of a plasma enhanced atomic layer deposition (PEALD) system configured to perform a PEALD process, depositing a TaCN film on said substrate using said PEALD process, where the deposited TaCN film has a C/Ta atomic ratio between 0.1 and 1 and a N/Ta atomic ratio between 0.5-1.2, modifying the deposited TaCN film by exposing the deposited TaCN film to plasma excited hydrogen or atomic hydrogen or a combination thereof in order to remove carbon from at least the plasma exposed portion of the deposited TaCN film, and forming a metal film on the modified TaCN film, wherein the modified TaCN film provides stronger adhesion to the metal film than the deposited TaCN film.

According to an embodiment of the invention, the PEALD process includes (a) exposing the substrate to a first process material containing tantalum, (b) purging the PEALD chamber of the first process material, (c) exposing the substrate to a second process material containing a plasma excited reducing agent, (d) purging the PEALD chamber of the second process material, (e) repeating steps (a)-(d) a desired number of times, until the TaC or TaCN film has a desired thickness.

DETAILED DESCRIPTION OF SEVERAL EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
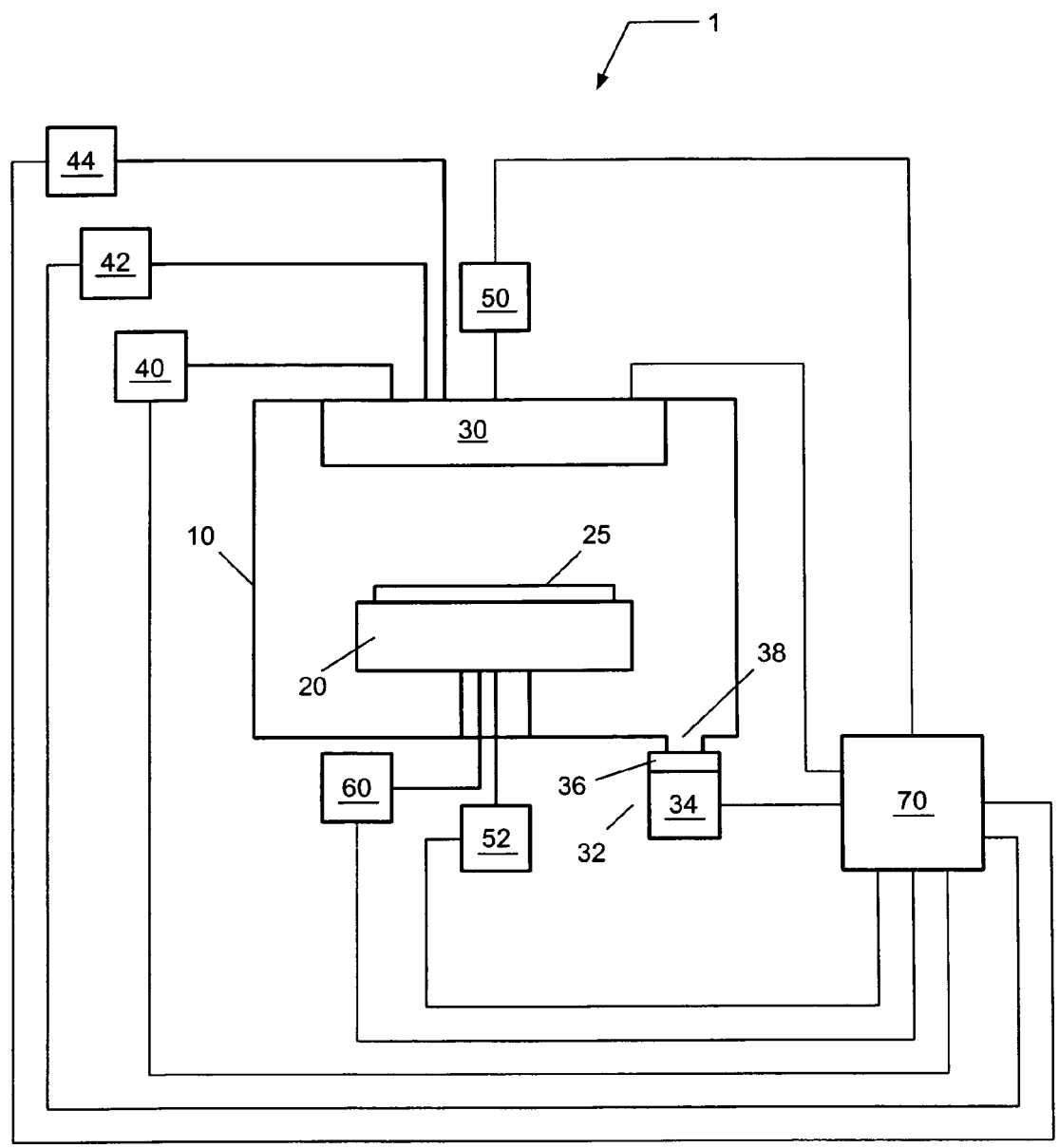
FIG. 1 depicts a schematic view of a PEALD system in accordance with an embodiment of the invention.

Referring now to the drawings, FIG. 1 illustrates a PEALD system 1 for depositing a thin TaC or TaCN film on a substrate according to one embodiment of the invention. For example, during the metallization of inter-connect and intra-connect structures for semiconductor devices in back-end-of-line (BEOL) operations, a thin conformal TaC or TaCN film may be deposited on wiring trenches or vias to minimize the migration of metal into the inter-level or intra-level dielectric, where the TaC or TaCN film provides acceptable adhesion to the dielectric and a Ru or Cu seed layers that is subsequently deposited on the TaC or TaCN film for subsequent metallization.

The PEALD system 1 comprises a process chamber 10 having a substrate holder 20 configured to support a substrate 25, upon which the thin TaC or TaCN film is formed. The process chamber 10 further comprises an upper assembly 30 coupled to a first process material supply system 40, a second process material supply system 42, and a purge gas supply system 44. Additionally, the PEALD system 1 includes a first power source 50 coupled to the process chamber 10 and configured to generate plasma in the process chamber 10, and a substrate temperature control system 60 coupled to substrate holder 20 and configured to elevate and control the temperature of substrate 25. Additionally, the PEALD system 1 includes a controller 70 that can be coupled to process chamber 10, substrate holder 20, upper assembly 30, first process material supply system 40, second process material supply system 42, purge gas supply system 44, first power source 50, and substrate temperature control system 60.

Alternatively, or in addition, controller 70 can be coupled to one or more additional controllers/computers (not shown), and controller 70 can obtain setup and/or configuration information from an additional controller/computer.

In FIG. 1, singular processing elements (10, 20, 30, 40, 42, 44, 50, and 60) are shown, but this is not required for the invention. The PEALD system 1 can include any number of processing elements having any number of controllers associated with them in addition to independent processing elements.

The controller 70 can be used to configure any number of processing elements (10, 20, 30, 40, 42, 44, 50, and 60), and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

Still referring to FIG. 1, the PEALD system 1 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Therefore, while aspects of the invention will be described in connection with the processing of a semiconductor substrate, the invention is not limited solely thereto.

The first process material supply system 40 and the second process material supply system 42 are configured to alternately introduce a first process material to process chamber 10 and a second process material to process chamber 10. The alternation of the introduction of the first process material and the introduction of the second process material can be cyclical, or it may be acyclical with variable time periods between introduction of the first and second materials. The first process material can, for example, comprise a Ta film precursor, such as a composition having the principal atomic or molecular species found in the TaC or TaCN film formed on substrate 25. For instance, the Ta film precursor can originate as a solid phase, a liquid phase, or a gaseous phase, and it may be delivered to process chamber 10 in a gaseous phase with or without the use of a carrier gas. The second process material can contain a reducing agent, which may also include atomic or molecular species found in the film formed on substrate 25. For instance, the reducing agent can originate as a solid phase, a liquid phase, or a gaseous phase, and it may be delivered to process chamber 10 in a gaseous phase with or without the use of a carrier gas.

Additionally, the purge gas supply system 44 can be configured to introduce a purge gas to process chamber 10. For example, the introduction of purge gas may occur between introduction of the first process material and the second process material to process chamber 10, or following the introduction of the second process material to process chamber 10, respectively. The purge gas can comprise an inert gas, such as a noble gas (i.e., helium, neon, argon, xenon, krypton), or nitrogen ($N_2$), or hydrogen ($H_2$).

Referring still to FIG. 1, the PEALD system 1 includes a plasma generation system configured to generate a plasma during at least a portion of the alternating introduction of the first process material and the second process material to process chamber 10. The plasma generation system can include a first power source 50 coupled to the process chamber 10, and configured to couple power to the process material process chamber 10. The first power source 50 may be a variable power source and may include a radio frequency (RF) generator and an impedance match network, and may further include an electrode through which RF power is coupled to the plasma in process chamber 10. The electrode can be formed in the upper assembly 30, and it can be configured to oppose the substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in process chamber 10 by reducing the reflected power. Match network topologies (e.g. L-type, π-type, T-type, etc.) and automatic control methods are well known to those skilled in the art.

Alternatively, the first power source 50 may include a RF generator and an impedance match network, and may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 50 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716, entitled "Plasma processing apparatus for etching, ashing, and film-formation"; the contents of which are herein incorporated by reference in its entirety.

According to one embodiment of the invention, the PEALD system 1 includes a substrate bias generation system configured to generate or assist in generating a plasma (through substrate holder biasing) during at least a portion of the alternating introduction of the first process material and the second process material to process chamber 10. The substrate bias system can include a substrate power source 52 coupled to the process chamber 10, and configured to couple power to the substrate 25. The substrate power source 52 may include a RF generator and an impedance match network, and may further include an electrode through which RF power is coupled to substrate 25. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the substrate holder electrode at multiple frequencies.

Although the plasma generation system and the substrate bias system are illustrated in FIG. 1 as separate entities, they may indeed comprise one or more power sources coupled to substrate holder 20.

Still referring to FIG. 1, PEALD system 1 includes substrate temperature control system 60 coupled to the substrate holder 20 and configured to elevate and control the temperature of substrate 25. Substrate temperature control system 60 comprises temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermo-electric heaters/coolers, which can be included in the substrate holder 20, as well as the chamber wall of the processing chamber 10 and any other component within the PEALD system 1.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 34 is configured to controllably evacuate the process chamber 10 to a pressure suitable for forming the thin film on substrate 25, and suitable for use of the first and second process materials. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. In conventional plasma processing devices utilized for dry plasma etch, a 300 to 5000 liter per second TMP is generally employed. Moreover, a device for monitoring chamber pressure (not shown) can be coupled to the processing chamber 10. The pressure measuring device can be, for example, a Type 628B Baratron absolute capacitance manometer commercially available from MKS Instruments, Inc. (Andover, Md.).

Still referring to FIG. 1, controller 70 can comprise a microprocessor, memory, and a digital I/O port capable of generating control voltages sufficient to communicate and activate inputs to the PEALD system 1 as well as monitor outputs from the PEALD system 1. Moreover, the controller 70 may be coupled to and may exchange information with the process chamber 10, substrate holder 20, upper assembly 30, first process material supply system 40, second process material supply system 42, purge gas supply system 44, first power source 50, second power source 52, substrate temperature controller 60, and pressure control system 32. For example, a program stored in the memory may be utilized to activate the inputs to the aforementioned components of the deposition system 1 according to a process recipe in order to perform a deposition process. One example of the controller 70 is a DELL PRECISION WORKSTATION 610™, available from Dell Corporation, Austin, Tex.

However, the controller 70 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, resides software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the PEALD system 1, or it may be remotely located relative to the PEALD system 1. For example, the controller 70 may exchange data with the PEALD system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the deposition system 1 via a wireless connection.

Figure 2:
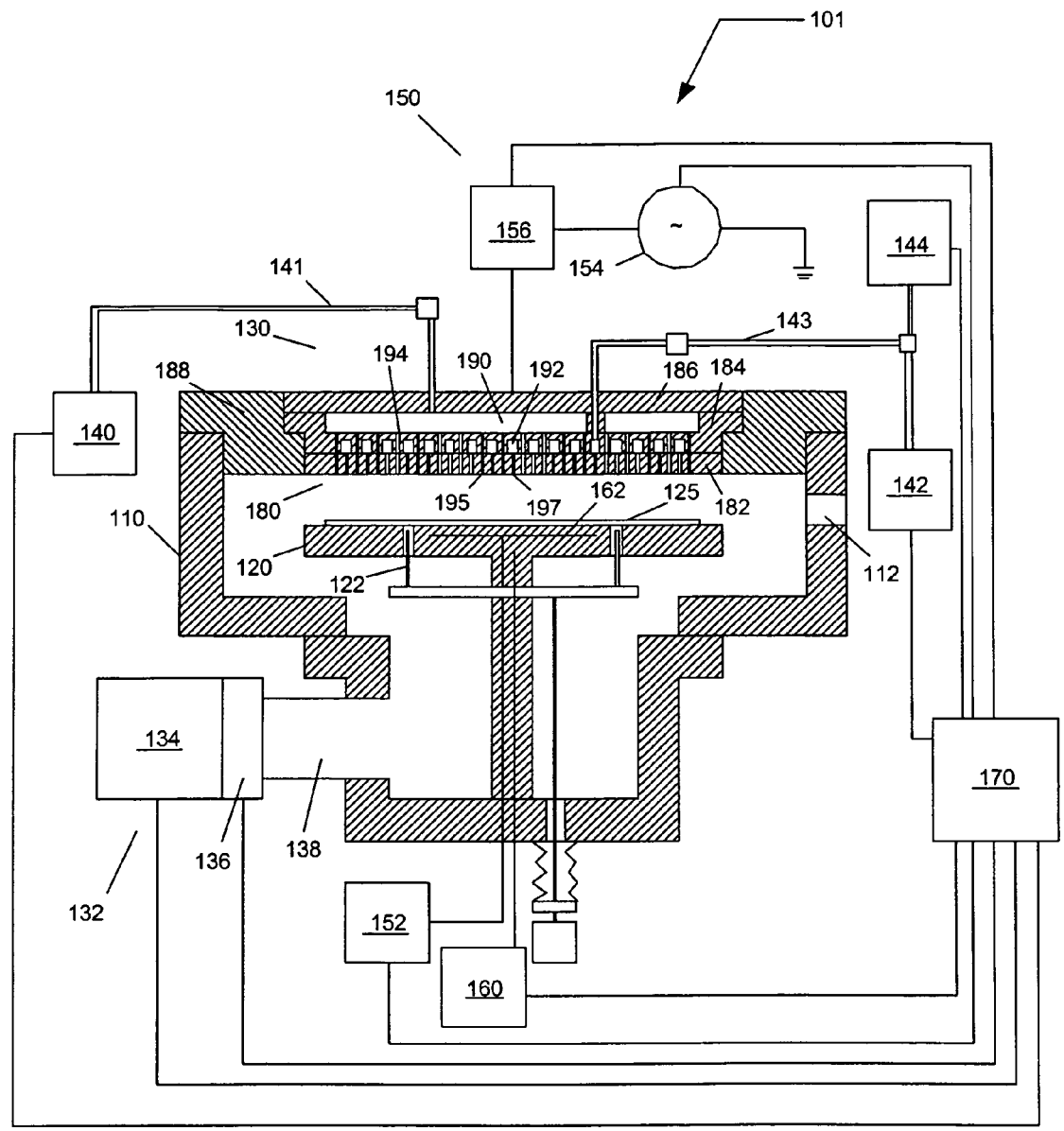
FIG. 2 depicts a schematic view of another PEALD system in accordance with an embodiment of the invention.

Referring now to FIG. 2, a PEALD system 101 is depicted. The PEALD system 101 comprises a process chamber 110 having a substrate holder 120 configured to support a substrate 125, upon which the thin TaC or TaCN film is formed. The process chamber 110 further comprises an upper assembly 130 coupled to a first process material supply system 140, a second process material supply system 142, and a purge gas supply system 144. Additionally, the deposition system 101 comprises a first power source 150 coupled to the process chamber 110 and configured to generate plasma in the process chamber 110, and a substrate temperature control system 160 coupled to substrate holder 120 and configured to elevate and control the temperature of substrate 125. Additionally, PEALD system 101 comprises a controller 170 that can be coupled to process chamber 110, substrate holder 120, upper assembly 130, first process material supply system 140, second process material supply system 142, purge gas supply system 144, first power source 150, and substrate temperature control system 160. The controller 170 may be implemented, for example, as the controller 70 described with respect to FIG. 1 above.

The PEALD system 101 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Substrates can be introduced to process chamber 110 through passage 112, and they may be lifted to and from an upper surface of substrate holder 120 via substrate lift system 122.

The first process material supply system 140 and the second process material supply system 142 are configured to alternately introduce a first process material to process chamber 110 and a second process material to process chamber 110. The alternation of the introduction of the first material and the introduction of the second material can be cyclical, or it may be acyclical with variable time periods between introduction of the first and second materials. The first process material can, for example, comprise a Ta film precursor, such as a composition having the principal atomic or molecular species found in the film formed on substrate 125. For instance, the film precursor can originate as a solid phase, a liquid phase, or a gaseous phase, and it may be delivered to process chamber 110 in a gaseous phase, and with or without a carrier gas. The second process material can, for example, comprise a reducing agent, which may also have atomic or molecular species found in the film formed on substrate 125. For instance, the reducing agent can originate as a solid phase, a liquid phase, or a gaseous phase, and it may be delivered to process chamber 110 in a gaseous phase, and with or without a carrier gas.

According to one embodiment of the invention, the first process material and the second process material are chosen in accordance with the elemental composition and characteristics of the TaCN film to be deposited on the substrate. The first process material can include a Ta film precursor containing a "Ta—N—C" structural unit, such as tertiary amyl imido-tris-dimethylamido tantalum $(Ta(NC(CH_3)_2C_2H_5)(N(CH_3)_2)_3$, hereinafter referred to as TAIMATA®; for additional details, see U.S. Pat. No. 6,593,484, the entire contents of which is incorporated herein by reference). In another example, the first process material can include (pentakis(diethylamido)tantalum $(Ta[N(C_2H_5)_2]_5$, PDEAT), pentakis (ethylmethylamido)tantalum $(Ta[N(C_2H_5CH_3)]_5$, PEMAT), pentakis(methylamido)tantalum $(Ta[N(CH_3)_2]_5$, PDMAT), (t-butylimino tris(diethylamino)tantalum $(Ta(NC(CH_3)_3)(N(C_2H_5)_2)_3$, TBTDET), $Ta(NC_2H_5)(N(C_2H_5)_2)_3$, $Ta(NC(CH_3)_2C_2H_5)(N(CH_3)_2)_3$, $Ta(NC(CH_3)_3)(N(CH_3)_2)_3$, or tert-butyl-tri-ethylmethylamido tantalum $((CH_3)_3CNTa(NC_2H_5(CH_3)_3)_3)$, TBTEMAT).

According to another embodiment of the invention, the first process material and the second process material are chosen in accordance with the elemental composition and characteristics of the TaC film to be deposited on the substrate. The first process material can include a Ta film precursor containing a "Ta—C" structural unit, including such Cp compounds as $Ta(\eta^5-C_5H_5)_2H_3$, $Ta(CH_2)(CH_3)(\eta^5-C_5H_5)_2$, $Ta(\eta^3-C_3H_5)(\eta^5-C_5H_5)_2$, $Ta(CH_3)_3(\eta^5-C_5H_5)_2$, $Ta(CH_3)_4(\eta^5-C_5(CH_3)_5)$, or $Ta(\eta^5-C_5(CH_3)_5)_2H_3$.

According to an embodiment of the invention, the second process material can include a reducing agent, such as hydrogen ($H_2$) gas, ammonia ($NH_3$), $N_2H_4$, $NH(CH_3)_2$, $N_2H_3CH_3$, silane ($SiH_4$), or disilane ($Si_2H_6$), or a combination of more than one thereof.

Additionally, the purge gas supply system 144 can be configured to introduce a purge gas to process chamber 110. For example, the introduction of purge gas may occur between introduction of the first process material and the second process material to process chamber 110, or following the introduction of the second process material to process chamber 110, respectively. The purge gas can comprise an inert gas, such as a noble gas (i.e., helium, neon, argon, xenon, krypton), or nitrogen ($N_2$), or hydrogen ($H_2$).

The first material supply system 140, the second material supply system 142, and the purge gas supply system 144 can include one or more material sources, one or more pressure control devices, one or more flow control devices, one or more filters, one or more valves, or one or more flow sensors. As discussed with respect to FIG. 1, the flow control devices can include pneumatic driven valves, electro-mechanical (solenoidal) valves, and/or high-rate pulsed gas injection valves. An exemplary pulsed gas injection system is described in greater detail in pending U.S. application Ser. No. 10/469,592, having publication No. 2004/0123803, which is incorporated herein by reference in its entirety.

Referring still to FIG. 2, the first process material is coupled to process chamber 110 through first material line 141, and the second process material is coupled to process chamber 110 through second material line 143. Additionally, the purge gas may be coupled to process chamber 110 through the first material line 141, the second material line 143 (as shown), or an independent line, or any combination thereof. In the embodiment of FIG. 2, the first process material, second process material, and purge gas are introduced and distributed within process chamber 110 through the upper assembly 130 that includes gas injection assembly 180. While not shown in FIG. 2, a sidewall gas injection valve may also be included in the processing system. The gas injection assembly 180 may comprise a first injection plate 182, a second injection plate 184, and a third injection plate 186, which are electrically insulated from process chamber 110 by insulation assembly 188. The first process material is coupled from the first process material supply system 140 to process chamber 110 through a first array of through-holes 194 in the second injection plate 184 and a first array of orifices 195 in the first injection plate 182 via a first plenum 190 formed between the second injection plate 184 and the third injection plate 186. The second process material, or purge gas, or both is coupled from the second process material supply system 142 or purge gas supply system 144 to process chamber 110 through a second array of orifices 197 in the first injection plate 182 via a second plenum 192 formed in the second injection plate 184.

Referring still to FIG. 2, the PEALD system 101 comprises a plasma generation system configured to generate a plasma during at least a portion of the alternating and cyclical introduction of the first process material and the second process material to process chamber 110. The plasma generation system can include a first power source 150 coupled to the process chamber 110, and configured to couple power to the first process material, or the second process material, or both in process chamber 110. The first power source 150 may be variable and includes a RF generator 154 and an impedance match network 156, and further includes an electrode, such as gas injection assembly 180, through which RF power is coupled to plasma in process chamber 110. The electrode is formed in the upper assembly 130 and is insulated from process chamber 110 via insulation assembly 188, and it can be configured to oppose the substrate holder 120. The RF frequency can, for example, range from approximately 100 kHz to approximately 100 MHz. Alternatively, the RF frequency can, for example, range from approximately 400 kHz to approximately 60 MHz. By way of further example, the RF frequency can, for example, be approximately 27.12 MHz or 13.56 MHz.

According to one embodiment of the invention, the PEALD system 101 includes a substrate bias generation system configured to generate or assist in generating a plasma (through substrate holder biasing) during at least a portion of the alternating introduction of the first process material and the second process material to process chamber 110. The substrate bias system can include a substrate power source 152 coupled to the process chamber 110, and configured to couple power to substrate 125. The substrate power source 152 may include a RF generator and an impedance match network, and may further include an electrode 162 through which RF power is coupled to substrate 125. The electrode 162 can be formed in substrate holder 120. For instance, substrate holder 120 can be electrically biased at a RF voltage via the transmission of RF power from a RF generator (not shown) through an impedance match network (not shown) to substrate holder 20. A typical frequency for the RF bias can range from about 0.1 MHz to about 100 MHz. RF bias systems for plasma processing are well known to those skilled in the art. Alternatively, RF power is applied to the substrate holder electrode at multiple frequencies.

Still referring to FIG. 2, PEALD system 101 includes temperature control system 160 coupled to the substrate holder 120 and configured to elevate and control the temperature of substrate 125. Substrate temperature control system 160 comprises at least one temperature control element, including a resistive heating element such as an aluminum nitride heater. The substrate temperature control system 160 can, for example, be configured to elevate and control the substrate temperature from room temperature to approximately 350° C. to 400° C. Alternatively, the substrate temperature can, for example, range from approximately 150° C. to 350° C. It is to be understood, however, that the temperature of the substrate is selected based on the desired temperature for causing PEALD deposition of a particular material on the surface of a given substrate. Therefore, the temperature can be higher or lower than described above. However, if the substrate temperature is too high, CVD growth may be observed instead of PEALD growth. In the example of TAIMATA, a substrate temperature equal to or below about 240° C. may be selected to achieve PEALD growth.

Furthermore, the process chamber 110 is further coupled to a pressure control system 132, including a vacuum pumping system 134 and a valve 136, through a duct 138, wherein the pressure control system 134 is configured to controllably evacuate the process chamber 110 to a pressure suitable for forming the thin film on substrate 125, and suitable for use of the first and second process materials.

Figure 3:
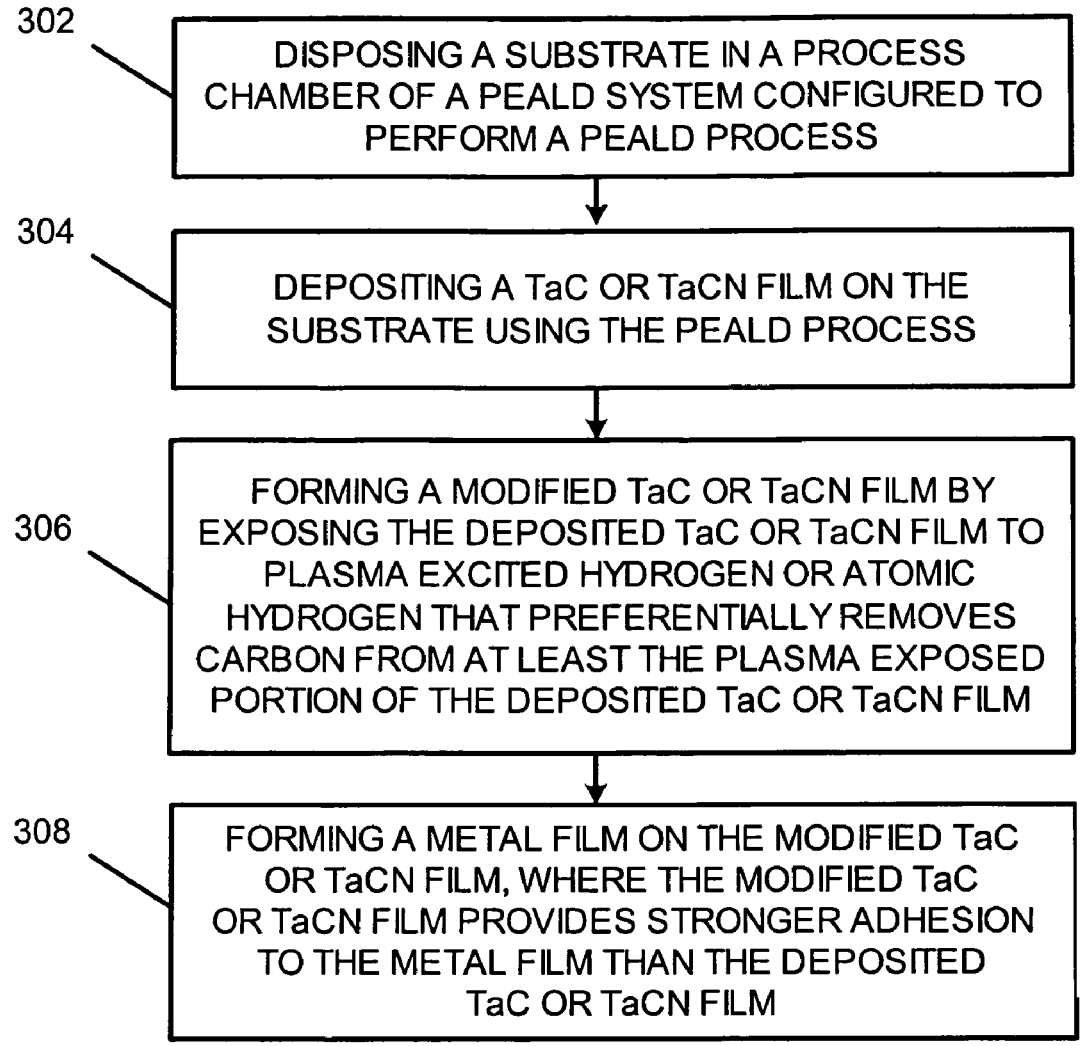
FIG. 3 shows a process flow diagram for processing a substrate according to an embodiment of the invention.

FIG. 3 shows a process flow diagram for processing a substrate according to an embodiment of the invention. The process flow of FIG. 3 may be performed by the PEALD systems 1/101 of FIG. 1, 2, or any other suitable PEALD system configured to perform a PEALD process. As seen in FIG. 3, the PEALD process begins when a substrate, such as a semiconductor substrate, is disposed in a process chamber in step 302.

In step 304, a TaC or TaCN film is deposited on the substrate using the PEALD process. As described in more detail in FIGS. 4 and 5, the PEALD process can include alternately exposing the substrate to a first process material containing a tantalum film precursor and a second process material containing plasma excited reducing agent (e.g., hydrogen), where the process chamber is purged between the exposures to the first and second process materials. The alternating exposure steps may be repeated any number of times until a TaC or TaCN film with a desired thickness is formed. For example, the TaC or TaCN film can have a thickness between 1 nm and 20 nm, between 1 nm and 10 nm, or between 2 nm and 5 nm. According to one embodiment of the invention, the TaC or TaCN film can have a thickness of about 3 nm.

Thereafter, in step 306, a modified TaC or TaCN film is formed by exposing the deposited TaC or TaCN film from step 304 to plasma excited hydrogen or atomic hydrogen, or a combination thereof, that preferentially removes carbon from at least the plasma exposed portion of the deposited TaC or TaCN film.

According to one embodiment of the invention, a TaCN film may be deposited by alternating exposures of TAIMATA and plasma excited hydrogen or atomic hydrogen to the substrate. While a plasma excited hydrogen process or atomic hydrogen process (non-plasma) may be used as alternative treatment processes in accordance with the present invention, it is to be understood that the plasma excited hydrogen process may generate atomic hydrogen species. The deposited TaCN film can have a C/Ta atomic ratio between 0.1 and 1 and a N/Ta atomic ratio between 0.5 and 1.2. Alternately, deposited TaCN film can have a C/Ta and N/Ta atomic ratios between 0.4 and 0.7. According to embodiments of the invention, the carbon content (and the C/Ta atomic ratio) of the modified TaCN film can be significantly reduced from that of the deposited TaCN film. In one example, the C/Ta atomic ratio can be about 0.5 in the deposited TaCN film and the C/Ta ratio can be about 0.1 in the modified TaCN film. The removal of carbon is believed to take place through chemical reaction of the plasma excited hydrogen or atomic hydrogen with the deposited film. However, in the case of a plasma, physical bombardment of the deposited film with excited hydrogen may also remove carbon and/or contaminants from the film.

In step 308, a metal film is formed on the modified TaC or TaCN film. The present inventors have discovered that the modified TaC or TaCN film provides stronger adhesion to the metal film than the deposited TaC or TaCN film. The metal film can include a thin layer of ruthenium (Ru) or Cu that acts as a seed layer for subsequent electroplating of bulk Cu on the seed layer.

Adhesion of the metal films to the modified TaCN films was evaluated by studying the wetting properties of the metal films after deposition onto the modified TaCN films and further annealing. For example, the presence of a uniform smooth Cu film, as viewed by scanning electron microscopy (SEM), indicated good wetting properties (and therefore strong adhesion between the films), whereas the presence of Cu islands on the modified TaCN films indicated poor wetting and weak adhesion properties.

The present inventors have thus recognized that the processing flow described in FIG. 3 can form a modified TaCN film with good diffusion barrier properties and improved adhesion to a metal film deposited thereon, such as Ru or Cu. It is contemplated that the improved adhesion may be due to removal of carbon atoms from at least the plasma exposed portion of the deposited TaCN film, thereby creating active Ta sites on the modified TaCN film that provide increased adhesion to the metal film. Similarly, it is contemplated that exposing a deposited TaC film to plasma excited hydrogen or atomic hydrogen may be effective in preferential carbon removal from the TaC film and thereby form active Ta sites on the modified TaC film that provide increased adhesion to the metal film. More generally, exposure of the TaC or TaCN films to plasma excited hydrogen or atomic hydrogen is believed to cause the exposed area to behave more like pure Ta, which has improved adhesion properties.

Figure 4:
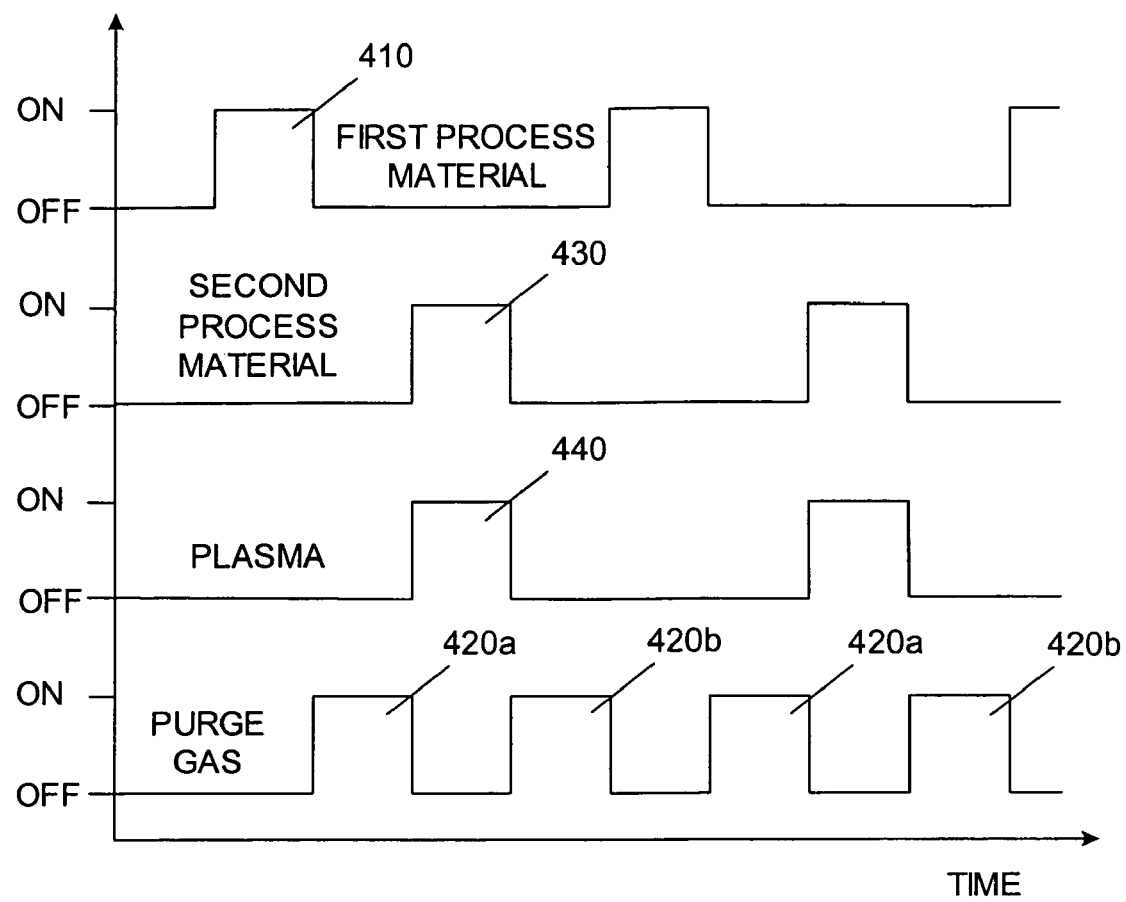
FIG. 4 is a timing diagram for an PEALD process for depositing a TaC or TaCN film in accordance with an embodiment of the invention.
Figure 5:
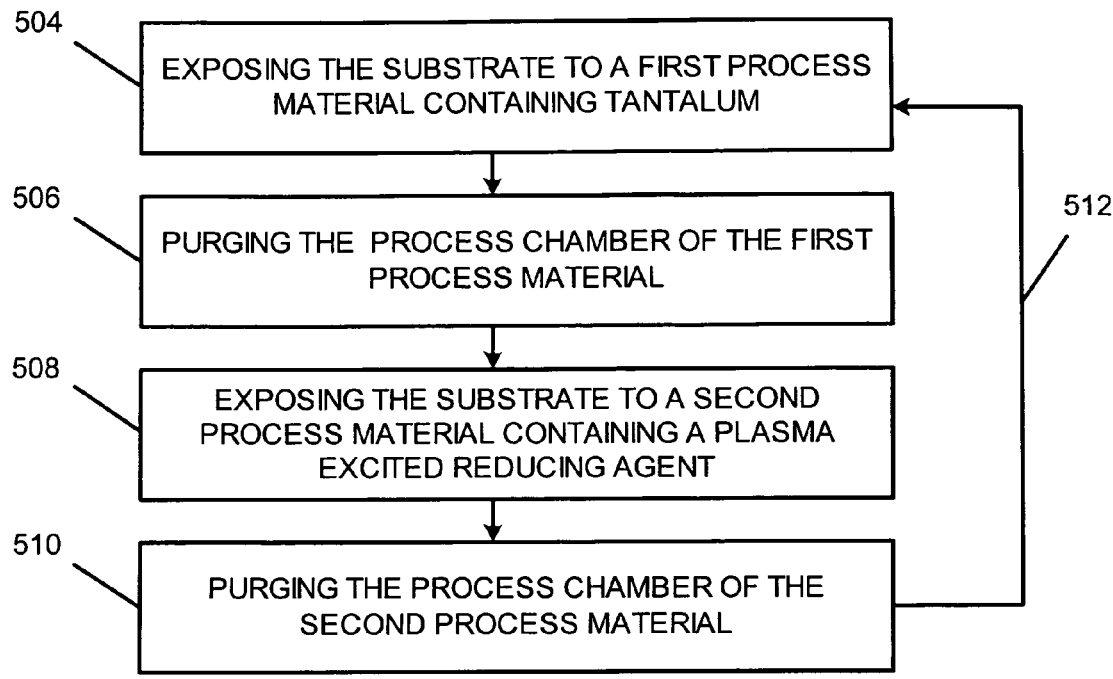
FIG. 5 shows a process flow diagram of an PEALD process for depositing a TaC or TaCN film in accordance with an embodiment of the invention.

Reference will now be made to FIGS. 4 and 5. FIG. 4 is a timing diagram for a PEALD process for depositing a TaC or TaCN film in accordance with an embodiment of the invention. FIG. 5 shows a process flow diagram of an PEALD process for depositing a TaC or TaCN film in accordance with an embodiment of the present invention. The process flow of FIG. 5 may be performed by the PEALD systems 1/101 of FIG. 1 or 2, or any other suitable PEALD system configured to perform a PEALD process. As seen in FIG. 5, the PEALD process begins when a substrate, such as a semiconductor substrate, is disposed in a process chamber in step 502.

In step 504, the substrate is exposed to a first process material containing tantalum in the absence of a plasma for a time period 410 to cause adsorption of the tantalum film precursor on exposed surfaces of the substrate. The first process material can be a chemically volatile but thermally stable material that can be deposited on the substrate surface in a self limiting manner. As described above, the first process material can include TAIMATA, PDEAT, PEMAT, PDMAT, TBT-DET, $Ta(NC_2H_5)(N(C_2H_5)_2)_3$, $Ta(NC(CH_3)_2C_2H_5)(N(CH_3)_2)_3$, or $Ta(NC(CH_3)_3)(N(CH_3)_2)_3$. The first process material may be delivered "neat" (undiluted by a carrier gas) to the process chamber or a carrier gas may be used to dilute the first process material. The carrier gas can, for example, include Ar or $N_2$. According to one embodiment of the invention, the first process material can be undiluted TAIMATA that is vaporized from TAIMATA liquid.

In step 506, the process chamber is purged of the first process material for a time period 420a. The purge step 506 allows the first process material to be exhausted from the PEALD process chamber by vacuum pumping prior to introduction of the second process material. The purging may include flowing a purge gas, for example Ar or $N_2$, into the process chamber.

In step 508, the substrate is exposed to a second process material comprising a plasma excited hydrogen gas. The second process material may be delivered undiluted to the process chamber or a carrier gas may be used to dilute the second process material. The carrier gas can, for example, include Argon or $N_2$. According to one embodiment of the invention, the reducing agent can be undiluted $H_2$.

In step 508, the plasma excitation of the second process material heats the reducing agent, thus causing ionization and/or dissociation of the reducing agent in order to form radicals and/or ions that chemically react with the first precursor material adsorbed on the substrate to facilitate the reduction process and reduce impurities within the deposited film. In an embodiment of the invention, the substrate holder bias can be between 100 W and 2000 W, while the upper assembly (electrode) 30, 130 is grounded. However, the actual substrate holder bias may vary depending on factors such as the composition and characteristics of the TaC or TaCN film to be deposited. Suitable high power levels that enable PEALD deposition of a TaC or TaCN film at improved deposition speeds and with reduced impurities in accordance with an embodiment of the invention can be determined by direct experimentation and/or design of experiments (DOE). Other adjustable process parameters such as substrate temperature, process pressure, type of first and second process materials and relative gas flows can also be determined by direct experimentation and/or DOE.

In step 510, the process chamber is purged of the first process material for a time period 420b. The purging may include flowing a purge gas, for example Ar or $N_2$, into the process chamber. Similarly, where multiple PEALD cycles are executed, a purge gas can be introduced after the reduction reaction takes place to expel the second process material before introduction of the first process material. This purging ensures that the reduction reaction occurs primarily at the adsorbed layer of the first process material on the substrate, rather than in the process chamber atmosphere prior to being deposited.

The reduction reaction completed by step 510 results in a thin layer of a TaC or TaCN being deposited on the substrate surface. The thin layer can have a thickness of about one atomic layer, or less. Once the reduction reaction takes place, steps 504, 506, 508, 510 can be repeated any number of times as shown by process flow 512 to deposit additional TaC or TaCN layers of the substrate and form the desired TaC or TaCN film. In one embodiment, the steps of FIG. 5 can be repeated between 2 and 100 times, more preferably between 10 and 70 times.

Although the second process material time period 430 and the plasma time period 440 are shown in FIG. 4 to exactly correspond to one another, it is sufficient for purposes of embodiments of the invention that such time periods merely overlap, as would be understood by one of ordinary skill in the art.

Further, while FIG. 4 shows no plasma generation during introduction of the first process material, a plasma may be generated during this time to assist in the adsorption process. Finally while the process of FIGS. 4 and 5 preferably include the purge steps shown, this is not required for the present invention.

Figure 6:
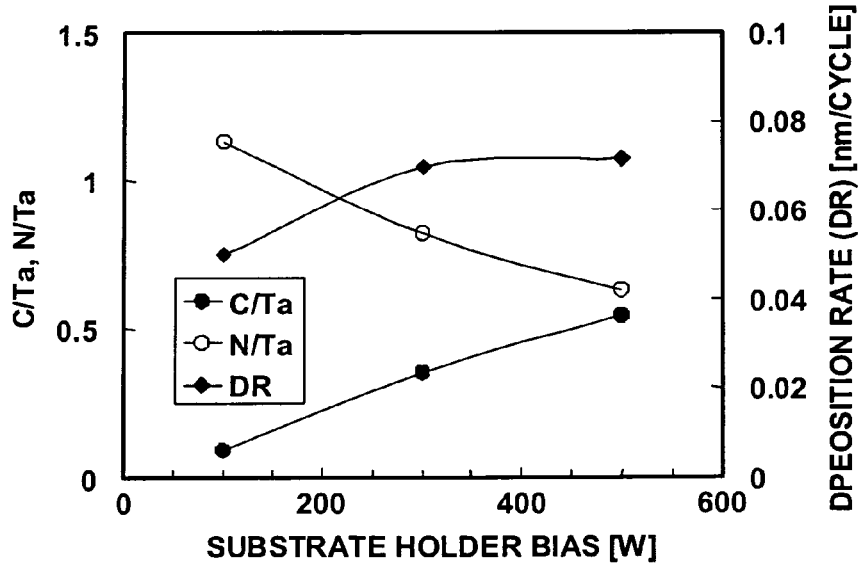
FIG. 6 presents PEALD process data from depositing a TaCN film according to an embodiment of the invention.

FIG. 6 presents PEALD process data for forming a TaCN film according to an embodiment of the invention. FIG. 5 shows TaCN deposition rate and C/Ta, N/Ta atomic ratios as function of substrate holder bias during the reduction step 508 of FIG. 5. In FIG. 6, a "cycle" refers to performing steps 504-510 once. The TaCN films were deposited using undiluted TAIMATA as a first processing material in step 504 of FIG. 5, undiluted $H_2$ as the second processing material in step 508, and undiluted Ar purge gas in steps 506 and 508. In FIG. 6, the Ta, C, and N contents of the deposited TaCN films was determined using Rutherford Backscattering Spectroscopy (RBS). The C/Ta atomic ratio in the deposited TaCN film increases from about 0.1 at a substrate holder bias of 100 W, to about 0.3 at a substrate holder bias of 300 W, and to about 0.5 at a substrate holder bias of 500 W. Furthermore, the N/Ta atomic ratio in the deposited TaCN film decreases from about 1.2 at a substrate holder bias of 100 W, to about 0.8 at a substrate holder bias of 300 W, and to about 0.6 at a substrate holder bias of 500 W. In FIG. 6, the deposition rate of the TaCN films is between about 0.06 and about 0.08 nm/cycle for a substrate holder bias greater than about 200 W.

Thus the present inventors have recognized that an increase in substrate holder bias during the PEALD deposition process generally results in an increase in carbon content and a decrease in nitrogen content in the deposited film. As exposure of the film to plasma excited hydrogen or atomic hydrogen is believed to remove carbon from the deposited TaC or TaCN films, then a preferred embodiment of the invention includes depositing a TaC or TaCN film at a relatively high substrate bias to reduce the nitrogen content and increase the carbon content of the film so that subsequent removal of carbon from the film will result in a modified film that approaches the characteristics of a pure Ta film. Thus, one embodiment of the invention may include depositing the TaC or TaCN film at a substrate bias of more than 100 W, preferably 200 W-500 W, and more preferably 500 W or more. Further it may be desirable to use a substrate bias that results in substantially equal C/Ta and N/Ta ratios.

In addition, while the exposure step 306 in FIG. 3 is shown to be performed after deposition is complete in step 304, it is believed that exposure of the film to hydrogen plasma or atomic hydrogen during deposition of the TaC or TaCN film can also improve film characteristics. For example, the exposure step 306 of FIG. 3 may be performed after a predetermined number of deposition cycles shown in FIG. 5 are run. Still further, the present invention may be used with other processes such as Argon plasma treatment to improve the characteristics of TaC or TaCN films. Example processes are disclosed in co-pending application Ser. No. 11/378,271, titled "Method of Plasma Enhanced Atomic Layer Deposition of TaC and TaCN films Having Good Adhesion to Copper", filed on even date herewith, the entire content of which is incorporate herein by reference.

Figure 7:
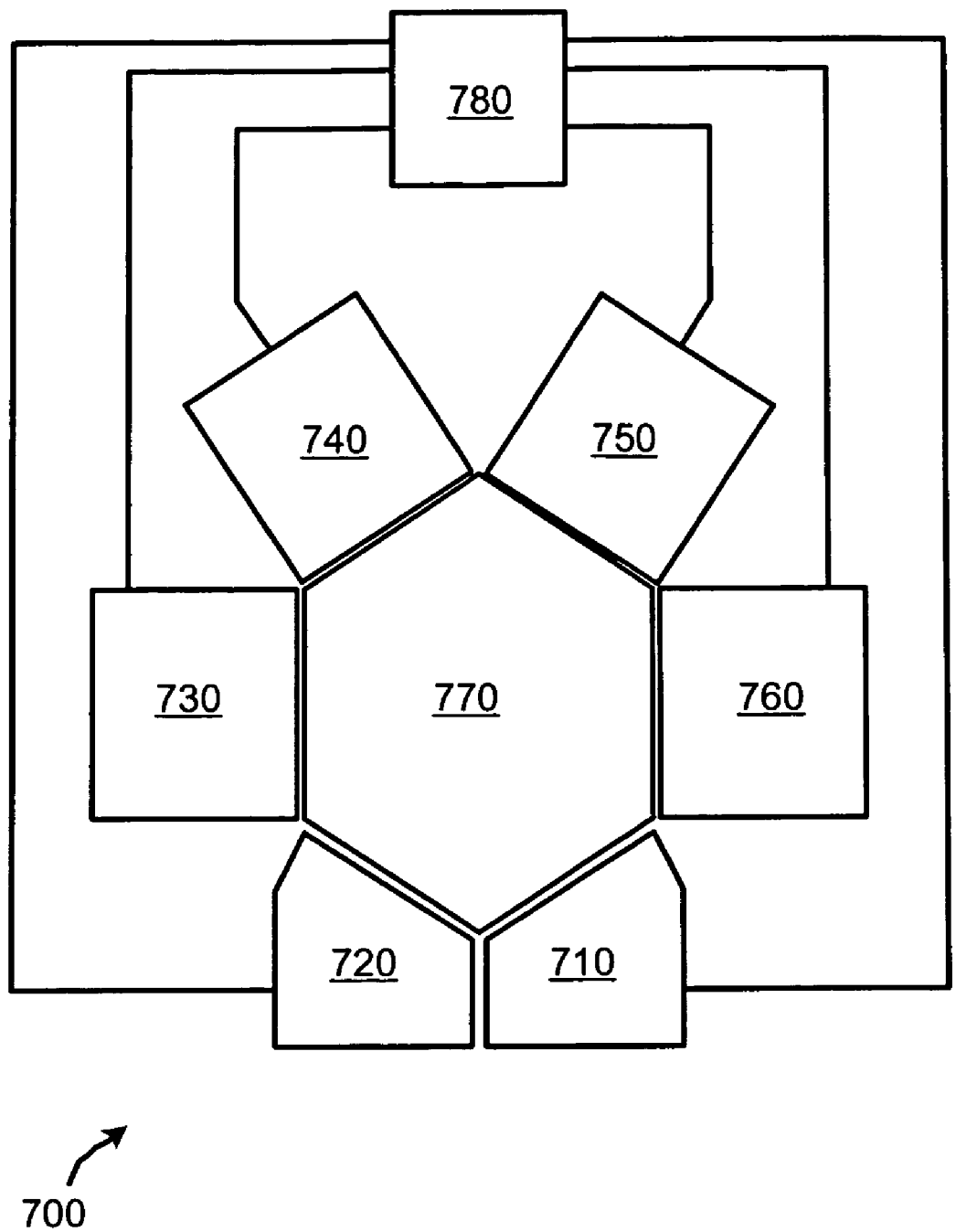
FIG. 7 is a simplified block diagram of a processing tool for processing a substrate in accordance with an embodiment of the present invention.

FIG. 7 is a simplified block diagram of a processing tool for processing a substrate in accordance with an embodiment of the present invention. The processing tool 700 contains substrate loading chambers 710 and 720, processing systems 730-760, a robotic transfer system 770 for transferring substrates within the processing tool 700, and a controller 780 for controlling the processing tool 700. In one example, processing system 730 can be utilized for pre-processing, such as plasma cleaning a substrate, and processing system 740 can be utilized to perform a PEALD process. For example, processing system 740 may be implemented as the PEALD system of FIG. 1 or 2 to perform the PEALD process descried herein for depositing a TaC or TaCN film. Furthermore, processing system 750 can be a designated treatment system such as plasma processing system containing a slot plane antenna (SPA) plasma source for generating a soft plasma for modifying the deposited TaC or TaCN film. Alternately, processing system 750 can be a designated treatments system that contains a heated filament for producing atomic hydrogen for modifying the deposited TaC or TaCN film. In FIG. 7, processing system 750 may be an i-PVD system for modifying a deposited TaC or TaCN film and/or for depositing a Cu metal film. Alternately, the processing system 750 may be a CVD system for depositing a Ru metal film. In one example, the Ru metal film can be deposited from a process gas containing $Ru_3(CO)_{12}$ and CO. The controller 780 can be coupled to and exchange information with substrate loading chambers 710 and 720, processing systems 730-760, and robotic transfer system 770. According to the present invention, the modifying process, such as Step 306 of FIG. 3, can be performed in a PEALD chamber where the deposition is performed or in a separate chamber capable of generating plasma excited hydrogen or atomic hydrogen.

Figure 8:
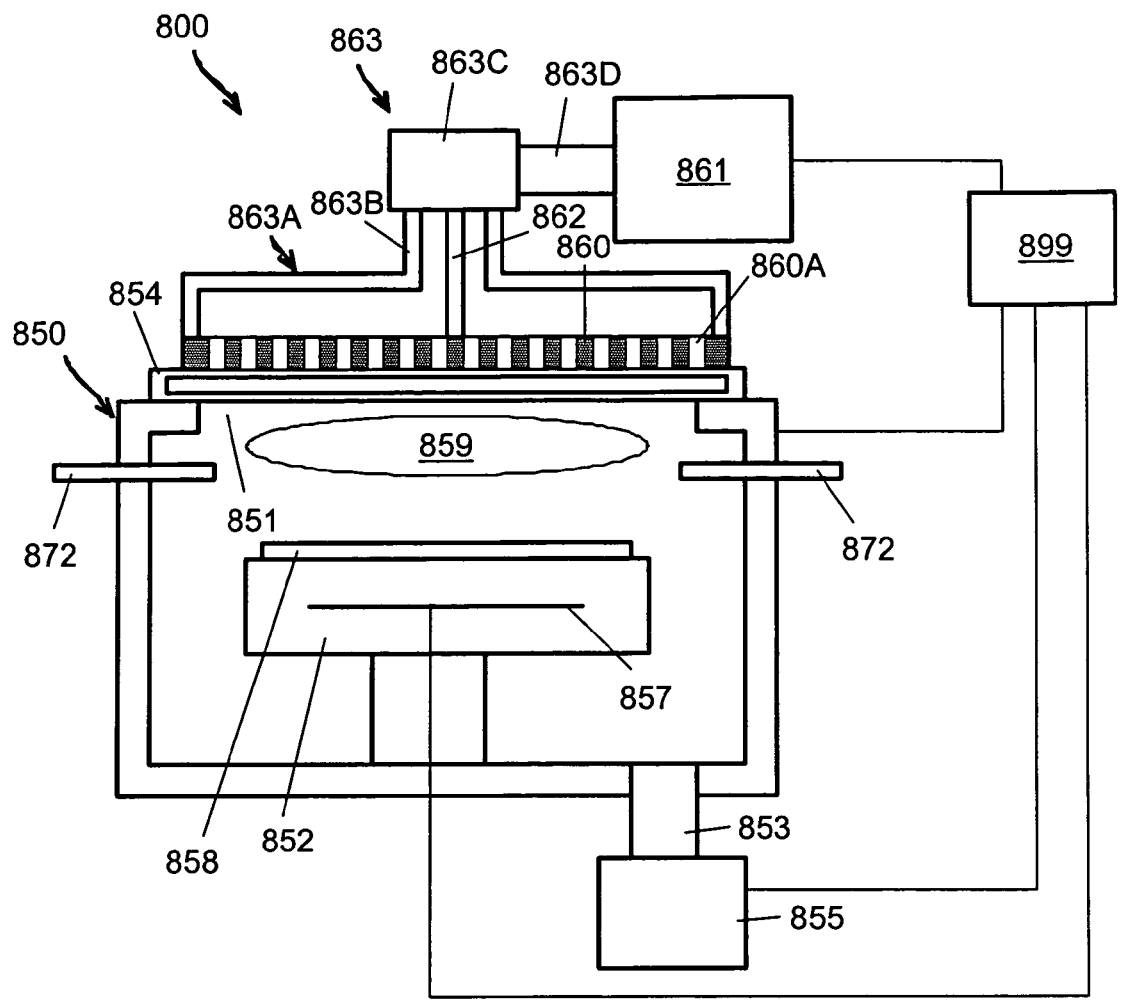
FIG. 8 is a simplified block-diagram of a plasma processing system containing a slot plane antenna (SPA) plasma source for generating a soft plasma for modifying a deposited TaC or TaCN film.

FIG. 8 is a simplified block-diagram of a plasma processing system containing a slot plane antenna (SPA) plasma source for generating a soft plasma for modifying a deposited TaC or TaCN film. The plasma produced in the plasma processing system 800 is characterized by low electron temperature (less than about 1.5 eV) and high plasma density (>1× $10^{12}/cm^3$), that enables substantially damage-free modification of the PEALD TaC or TaCN film according to an embodiment of the invention. The plasma processing system 800 can, for example, be a TRIAS™ SPA processing system, commercially available from Tokyo Electron Limited, Akasaka, Japan. The plasma processing system 800 contains a process chamber 850 having an opening portion 851 in the upper portion of the process chamber 850 that is larger than a substrate 858. A cylindrical top plate 854 made of quartz, aluminum oxide, silicon, or aluminum nitride is provided to cover the opening portion 851. Gas lines 872 are located in the side wall of the upper portion of process chamber 850 below the top plate 854. In one example, the number of gas lines 872 can be 16 (only two of which are shown in FIG. 8). Alternately, a different number of gas feed lines 872 can be used. The gas lines 872 can be circumferentially arranged in the process chamber 850, but this is not required for the invention. A process gas can be evenly and uniformly supplied into the plasma region 859 in process chamber 850 from the gas lines 872.

In the plasma processing system 850, microwave power is provided to the process chamber 850 through the top plate 854 via a plane antenna member 860 having a plurality of slots 860A. The slot plane antenna 860 can be made from a metal plate, for example copper. In order to supply the microwave power to the slot plane antenna 860, a waveguide 863 is disposed on the top plate 854, where the waveguide 863 is connected to a microwave power supply 861 for generating microwaves with a frequency of 2.45 GHz, for example. The waveguide 863 contains a flat circular waveguide 863A with a lower end connected to the slot plane antenna 860, a circular (coaxial) waveguide 863B connected to the upper surface side of the circular waveguide 863A, and an outport (bottom surface in FIG. 8) of a coaxial waveguide converter 863C connected to the upper surface side of the circular (coaxial) waveguide 863B. Furthermore, a rectangular waveguide 863D is connected to the input port (side surface in FIG. 8) of the coaxial waveguide converter 863C and the microwave power supply 861.

Inside the circular waveguide 863B, an axial portion 862 (or inner conductor) of an electro-conductive material is coaxially provided, so that one end of the axial portion 862 is connected to the central (or nearly central) portion of the upper surface of slot plane antenna 860, and the other end of the axial portion 862 is connected to the upper surface of the circular waveguide 863B, thereby forming a coaxial structure. As a result, the circular waveguide 863B is constituted so as to function as a coaxial waveguide. The microwave power can, for example, be between about 0.5 W/cm² and about 4 W/cm². Alternately, the microwave power can be between about 0.5 W/cm² and about 3 W/cm².

In addition, in the vacuum process chamber 850, a substrate holder 852 is provided opposite the top plate 854 for supporting and heating a substrate 858 (e.g., a wafer). The substrate holder 852 contains a heater 857 to heat the substrate 858, where the heater 857 can be a resistive heater. Alternately, the heater 857 may be a lamp heater or any other type of heater. Furthermore the process chamber 850 contains an exhaust line 853 connected to the bottom portion of the process chamber 850 and to a vacuum pump 855.

Still referring to FIG. 8, a controller 899 includes a microprocessor, a memory, and a digital I/O port capable of generating control voltages sufficient to communicate and activate inputs of the plasma processing system 800 as well as monitor outputs from the plasma processing system 800. Moreover, the controller 899 is coupled to and exchanges information with process chamber 850, the pump 855, the heater 857, and the microwave power supply 861. A program stored in the memory is utilized to control the aforementioned components of plasma processing system 800 according to a stored process recipe. One example of processing system controller 899 is a UNIX-based workstation. Alternately, the controller 899 can be implemented as a general-purpose computer, digital signal processing system, or any of the controllers described herein. Moreover, the controller 899 may be locally located relative to the plasma processing system 800 or it may be remotely located relative to the plasma processing system 800 via an internet or intranet. For additional details, a plasma process system having a slotted plane antenna (SPA) plasma source is described in co-pending European Patent Application EP1361605A1, titled "METHOD FOR PRODUCING MATERIAL OF ELECTRONIC DEVICE.", the entire contents of which is hereby incorporated by reference.

Figure 9:
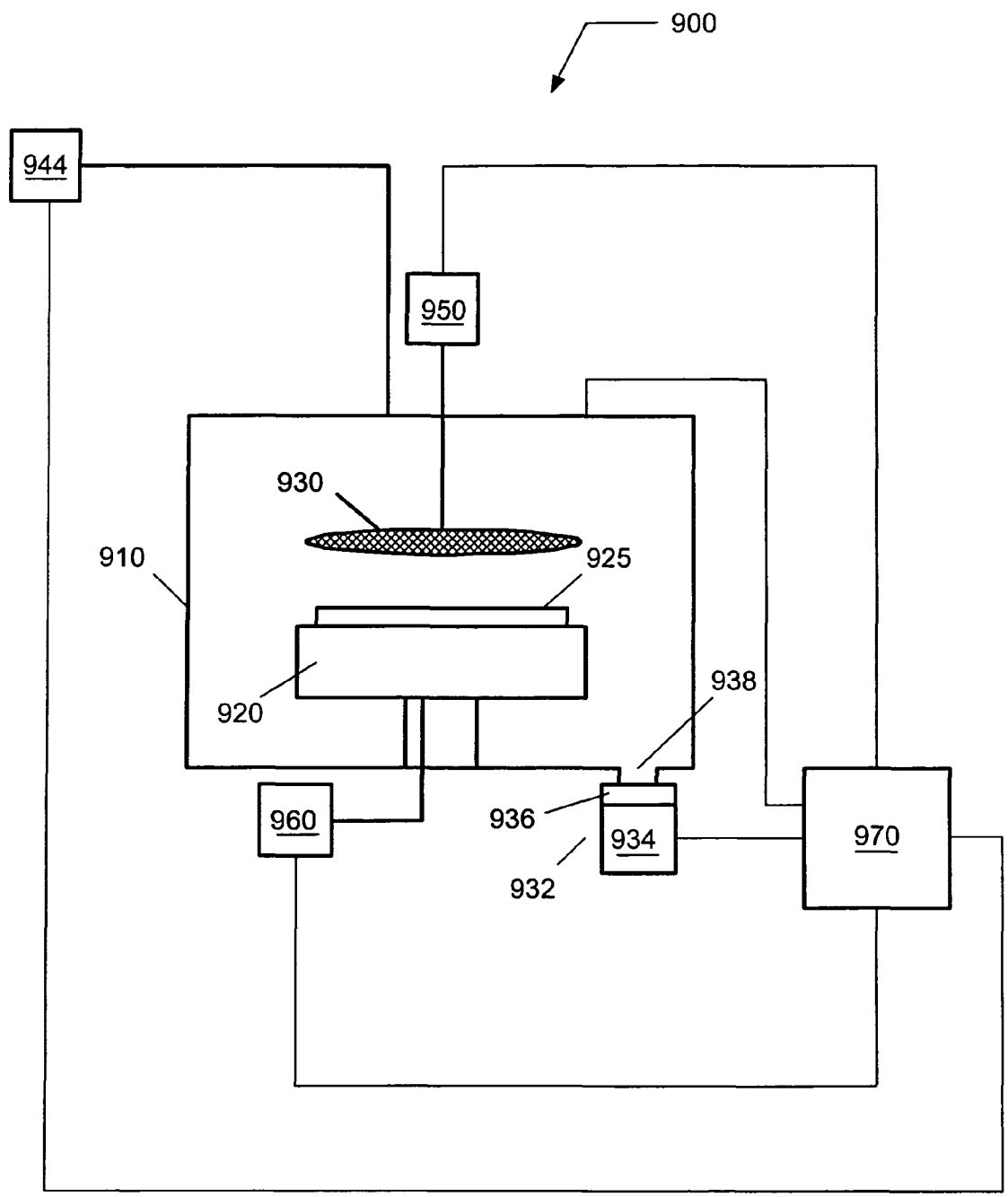
FIG. 9 is simplified block-diagram of a treatment system containing a heated filament configured for creating atomic hydrogen for modifying a deposited TaC or TaCN film.

FIG. 9 is simplified block-diagram of a treatment system containing a heated filament configured for creating atomic hydrogen for modifying a deposited TaC or TaCN film. The treatment system 900 contains many system components similar to that of PEALD system 1 depicted in FIG. 1, including a process chamber 910 having a substrate holder 920 configured to support a substrate 925, upon which the deposited TaC or TaCN film is placed and modified. The process chamber 910 further comprises $H_2$ gas supply system 944 for introducing $H_2$ gas into the process chamber 910 and a power source 950 coupled to the process chamber 910 and configured to heat a filament 930 for generating atomic in the process chamber 910 for modifying the deposited TaC or TaCN film.

The treatment system 900 contains a substrate temperature control system 960 coupled to substrate holder 920 and configured to elevate and control the temperature of substrate 925. Additionally, the treatment system 900 includes a controller 970 that can be coupled to process chamber 910, substrate holder 920, upper assembly 930, $H_2$ gas supply system 944, power source 950, and substrate temperature control system 960. Furthermore, the process chamber 910 is further coupled to a pressure control system 932, including a vacuum pumping system 934 and a valve 936, through a duct 938, wherein the pressure control system 934 is configured to controllably evacuate the process chamber 910 to a pressure suitable for treating the film on the substrate 25 with atomic hydrogen.

Although only certain exemplary embodiments of inventions have been described in detail above, those skilled in the art will readily appreciate that many modifications are possible in the exemplary embodiments without materially departing from the novel teachings and advantages of this invention. Accordingly, all such modifications are intended to be included within the scope of this invention.

The invention claimed is:

1. A method for processing a substrate, comprising:
   disposing said substrate in a process chamber of a plasma enhanced atomic layer deposition (PEALD) system configured to perform a PEALD process;
   depositing a TaC or TaCN film on said substrate using said PEALD process;
   after the depositing, moving the substrate including the deposited TaC or TaCN film to a separate chamber from the process chamber;
   modifying the deposited TaC or TaCN film by exposing the deposited film to atomic hydrogen generated by a non-plasma process in the separate chamber from the process chamber in order to remove carbon from at least a plasma exposed portion of the deposited TaC or TaCN film, and the separate chamber includes a treatment system having a heated filament positioned above a substrate holder on which the substrate is positioned, and the heated filament creates the atomic hydrogen within the separate chamber; and forming a metal film on the modified TaC or TaCN film, wherein the modified TaC or TaCN film provides stronger adhesion to the metal film than the deposited TaC or TaCN film.

2. The method of claim 1, wherein the forming a metal film comprises depositing a Ru film or a Cu film on the modified TaC or TaCN film.

3. The method of claim 1, wherein the depositing comprises:
(a) exposing said substrate to a first process material comprising tantalum,
(b) purging said PEALD chamber of the first process material,
(c) exposing said substrate to a second process material comprising plasma excited reducing agent,
(d) purging said PEALD chamber of the second process material, and
(e) repeating steps (a)-(d) a predetermined number of times.

4. The method of claim 3, wherein steps (a)-(d) are performed between 2 and 100 times.

5. The method of claim 3, wherein steps (a)-(d) are performed between 10 and 70 times.

6. The method of claim 3, wherein the depositing comprises depositing the TaC film and the first process material comprises $Ta(\eta^5-C_5H_5)_2H_3$, $Ta(CH_2)(CH_3)(\eta^5-C_5H_5)_2$, $Ta(\eta^3-C_3H_5)(\eta^5-C_5H_5)_2$, $Ta(CH_3)_3(\eta^5-C_5H_5)_2$, $Ta(CH_3)_4(\eta^5-C_5(CH_3)_5)$, or $Ta(\eta^5-C_5(CH_3)_5)_2H_3$.

7. The method of claim 3, wherein the depositing comprises depositing the TaCN film and the first process material comprises TAIMATA, PDEAT, PEMAT, PDMAT, TBTDET, $Ta(NC_2H_5)(N(C_2H_5)_2)_3$, $Ta(NC(CH_3)_2C_2H_5)(N(CH_3)_2)_3$, $Ta(NC(CH_3)_3)(N(CH_3)_2)_3$, or TBTEMAT.

8. The method of claim 3, wherein the second process material comprises $H_2$, $NH_3$, $N_2H_4$, $NH(CH_3)_2$, $N_2H_3CH_3$, $SiH_4$, or $Si_2H_6$, or a combination of two or more thereof.

9. The method of claim 3, wherein the purging steps (b) and (d) comprise flowing a purge gas through the process chamber, the purge gas comprising a noble gas, $N_2$, or $H_2$, or a combination of two or more thereof.

10. The method of claim 3, wherein step (c) comprises flowing undiluted $H_2$ gas into the PEALD chamber and exposing said substrate to plasma excited $H_2$.

11. The method of claim 3, wherein step (c) further comprises applying a substrate holder bias between 100 W and 2000 W.

12. The method of claim 1, wherein the heated filament is positioned within the separate chamber and below a supply system through which $H_2$ gas is introduced into the separate chamber to generate the atomic hydrogen within the separate chamber via the heated filament.

13. The method of claim 12, further comprising:
heating the substrate holder via a substrate temperature control system coupled to the substrate holder.

14. The method of claim 1, wherein the deposited TaC or TaCN film has a thickness between about 1 nm and about 20 nm.

15. The method of claim 1, wherein the deposited TaC or TaCN film has a thickness between about 2 nm and about 5 nm.

16. A method for processing a substrate, comprising:
disposing said substrate in a process chamber of a plasma enhanced atomic layer deposition (PEALD) system configured to perform a PEALD process;
depositing a TaCN film on said substrate using said PEALD process, wherein the deposited TaCN film has a C/Ta atomic ratio between 0.1 and 1 and a N/Ta atomic ratio between 0.5-1.2;
after the depositing, moving the substrate including the deposited TaCN film to a separate chamber from the process chamber;
modifying the deposited TaCN film by exposing the deposited TaCN film to atomic hydrogen generated by a non-plasma process in the separate chamber from the process chamber in order to remove carbon from at least a plasma exposed portion of the deposited TaCN film, and the separate chamber includes a treatment system having a heated filament positioned above a substrate holder on which the substrate is positioned, and the heated filament creates the atomic hydrogen within the separate chamber; and
forming a metal film on the modified TaCN film, wherein the modified TaCN film provides stronger adhesion to the metal film than the deposited TaCN film.

17. The method of claim 16, wherein the C/Ta and N/Ta atomic ratios in the deposited TaCN film are between about 0.4 and about 0.7.

18. The method of claim 17, wherein the C/Ta atomic ratio of the modified film is approximately 0.1.

19. The method of claim 16, wherein the forming a metal film comprises depositing a Ru film or a Cu film on the modified TaCN film.

20. The method of claim 16, wherein the depositing comprises:
(a) exposing said substrate to a first process material comprising tantalum,
(b) purging said PEALD chamber of the first process material,
(c) exposing said substrate to a second process material comprising plasma excited reducing agent,
(d) purging said PEALD chamber of the second process material, and
(e) repeating steps (a)-(d) a predetermined number of times.

21. The method of claim 20, wherein steps (a)-(d) are performed between 2 and 100 times.

22. The method of claim 20, wherein steps (a)-(d) are performed between 10 and 70 times.

23. The method of claim 20, wherein the depositing comprises depositing the TaCN film with a deposition rate between about 0.05 and about 0.1 nm during steps (a)-(d).

24. The method of claim 20, wherein the depositing comprises depositing the TaCN film and the first process material comprises TAIMATA, PDEAT, PEMAT, PDMAT, TBTDET, $Ta(NC_2H_5)(N(C_2H_5)_2)_3$, $Ta(NC(CH_3)_2C_2H_5)(N(CH_3)_2)_3$, $Ta(NC(CH_3)_3)(N(CH_3)_2)_3$, or TBTEMAT.

25. The method of claim 20, wherein the second process material comprises $H_2$, $NH_3$, $N_2H_4$, $NH(CH_3)_2$, $N_2H_3CH_3$, $SiH_4$, or $Si_2H_6$, or a combination of two or more thereof.

26. The method of claim 20, wherein the purging steps (b) and (d) comprise flowing a purge gas through the process chamber, the purge gas comprising a noble gas, $N_2$, or $H_2$, or a combination of two or more thereof.

27. The method of claim 20, wherein step (c) comprises flowing undiluted $H_2$ gas into the PEALD chamber and exposing said substrate to plasma excited $H_2$.

28. The method of claim 20, wherein step (c) further comprises applying a substrate holder bias between 100 W and 2000 W.

29. The method of claim 28, wherein step (c) comprises applying a substrate holder bias between 300 and 500 W.

30. The method of claim 28, wherein step (c) comprises applying a substrate holder bias of 500 W.

31. The method of claim 16, wherein the deposited TaCN film has a thickness between about 1 nm and about 20 nm.

32. The method of claim 16, wherein the deposited TaCN film has a thickness between about 2 nm and about 5 nm.

33. The method of claim 16, wherein the heated filament is positioned within the separate chamber and below a supply system through which $H_2$ gas is introduced into the separate chamber to generate the atomic hydrogen within the separate chamber via the heated filament.

34. The method of claim 33, further comprising:
heating the substrate holder via a substrate temperature control system coupled to the substrate holder.

* * * * *